US007372708B2

(12) United States Patent
Terasaki et al.

(10) Patent No.: US 7,372,708 B2
(45) Date of Patent: May 13, 2008

(54) POSITION DETECTING SWITCH FIXTURE FOR CYLINDER

(75) Inventors: Atsushi Terasaki, Tsukuba-gun (JP); Mitsuru Machijima, Tsukuba-gun (JP)

(73) Assignee: SMC Corporation, Tokyo (JP)

( * ) Notice: Subject to any disclaimer, the term of this patent is extended or adjusted under 35 U.S.C. 154(b) by 514 days.

(21) Appl. No.: 11/066,289

(22) Filed: Feb. 28, 2005

(65) Prior Publication Data

US 2005/0194239 A1 Sep. 8, 2005

(30) Foreign Application Priority Data

Mar. 5, 2004 (JP) ............................ 2004-062931

(51) Int. Cl.
*H05K 7/02* (2006.01)
*H05K 7/04* (2006.01)

(52) U.S. Cl. ....................... 361/810; 361/807; 200/275

(58) Field of Classification Search ................ 361/810, 361/807; 200/237-238, 275
See application file for complete search history.

(56) References Cited

U.S. PATENT DOCUMENTS 6,571,681 B2 * 6/2003 Sakurai ....................... 92/5 R

FOREIGN PATENT DOCUMENTS

DE 4041090 C2 6/1992
DE 4332840 A1 9/1994
DE 29717492 U1 1/1998

* cited by examiner

*Primary Examiner*—Tuan T. Dinh
*Assistant Examiner*—Hung S Bui
(74) *Attorney, Agent, or Firm*—Oblon, Spivak, McClelland, Maier & Neustadt, P.C.

(57) ABSTRACT

A position detecting switch fixture for cylinder, having a pair of clamping reinforced plates at both ends of a mounting band, and clamping/holding a position detecting switch between these plates by a clamping screw. A holder is installed between the pair of clamping reinforced plates to clamp the position detecting switch. The clamping screw has the following clamping positions: a first clamping position where, due to the clamping of the pair of clamping reinforced plates, the base ends of the clamping reinforced plates adjacent to a cylinder tube approach each other, whereby the mounting band is temporarily fixed to the cylinder tube but the switch is not fixed; a second clamping position where, due to subsequent clamping, the switch is fixed to the holder; and a third clamping position where, due to further clamping, clamping restriction sections provided in the holder abut against each other to restrict still further clamping.

10 Claims, 6 Drawing Sheets

POSITION DETECTING SWITCH FIXTURE FOR CYLINDER

FIELD OF THE INVENTION

The present invention relates to a fixture for mounting a position detecting switch for detecting operating positions of a piston or the like, on the outer peripheral surface of a fluid pressure cylinder.

DESCRIPTION OF THE RELATED ART

With respect to the fluid pressure cylinder, a detecting device utilizing magnetism has hitherto been mounted to detect operating positions of a piston or the like. This type of detecting device includes a position detecting switch that is fixed, by a mounting band or the like, to an arbitrary position on the outer peripheral surface of a cylinder tube mounted to the piston, comprising a permanent magnet and a nonmagnetic substance, and that detects the approach of a magnet.

The position detecting switch fixture using the aforementioned mounting band is usually configured so that a mounting band having a holder for the position detecting switch is fixed to the cylinder tube by a clamping screw, and that the position detecting switch is position-adjusted with respect to the holder and fixed thereto by a fixing screw or the like. Alternatively, the position detecting switch fixture is configured so as to also clamp and fix the position detecting switch to the surface of the cylinder tube by a clamping screw for fixing the mounting band.

However, the former fixing method requires clamping by two screws for mounting the position detecting switch, so that it takes time and effort with mounting work, thereby making work troublesome. Also, in the latter method, the position detecting switch is pressed against the outer peripheral surface of the cylinder tube by strong clamping by the mounting band, so that it is necessary to make the position detecting switch itself so as to have a high strength. Otherwise, the switch may be broken, or the detection property thereof may be affected by the clamping.

SUMMARY OF THE INVENTION

Accordingly, it is an object of the present invention to provide a position detecting switch fixture for a cylinder, in which use of a single clamping screw allows the fixing of the mounting band for the position detecting switch to the cylinder tube, as well as the fixing of the position detecting switch subjected to a fine adjustment of position by the clamping screw, thereby improving work efficiency in the mounting/demounting of the mounting band with respect to the cylinder tube, and the positioning and mounting of the position detecting switch.

It is another object of the present invention to provide a position detecting switch fixture for a cylinder, in which use of a single clamping screw allows the adjustment of the clamping force with respect to the position detecting switch substantially irrespective of the clamping force of the mounting band, as well as the inhibition of the position detecting switch from being subjected to a force larger than necessary.

It is still another object of the present invention to provide a position detecting switch fixture for a cylinder, the fixture enabling a single mounting band to meet a plurality of shapes of position detecting switches by the exchange of holders.

In order to achieve the above-described objects, a position detecting switch fixture according to the present invention basically includes: a mounting band to be wound around a cylinder tube; a pair of clamping reinforced plates mutually opposing at both ends of the mounting band; a position detecting switch; a holder mounted to the mounting band for holding the position detecting switch; and a clamping screw passed through the pair of clamping reinforced plates and retaining the position detecting switch together with the holder, between the clamping reinforced plates. Herein, the holder covering at least both side surfaces of a held section of the position detecting switch along the side surfaces, is installed between the pair of clamping reinforced plates to position-adjustably clamp the position detecting switch, and the clamping screw is also passed through the holder. Here, the clamping screw is provided with the following clamping positions: a first clamping position where, due to the clamping of the pair of clamping reinforced plates by the clamping screw, the base ends of the clamping reinforced plates adjacent to the cylinder tube approach each other and thereby the mounting band is temporarily fixed with respect to the cylinder tube, but the position detecting switch is not position-fixed; a second clamping position where, due to subsequent clamping of the pair of clamping reinforced plates by the screw, the ends of the pair of clamping reinforced plates opposite to the aforementioned base ends approach each other and thereby the switch is fixed to the holder, as well as the clamping and fixing of the cylinder tube is enhanced; and a third clamping position where, due to further clamping of the pair of clamping reinforced plates by the screw, clamping restriction sections provided in the holder abut against each other to restrict still further clamping of the pair of clamping reinforced plates by the screw.

The above-described holder may be configured so that, by mutually connecting side surface sections covering both side surfaces of the held section of the position detecting switch at a connection section provided on the side adjacent to the cylinder tube, the cross section of the holder is formed so as to be substantially U-shaped, and a housing section of the position detecting switch is formed in a position on the side adjacent to the inner surface of the connection section. Each of the side surface sections has a clamping section further extending from the holding section for the position detecting switch; a slit is formed between the pair of clamping sections; and the clamping screw is passed through the clamping sections.

Also, the holder may be configured so that a switch through hole covering at least the side surface of the held section of the position detecting switch, and a clamping screw hole to be passed through by the clamping screw, the switch through hole and the clamping screw hole being provided in a holder block constituted of a material having rubber elasticity. The switch through hole may be disposed in a position in the holder, near to the cylinder tube. Also, clamping restriction members for restricting excessive clamping at the third clamping position by the clamping screw may be attached to the holder.

In the switch fixture with the above arrangements, after the mounting band having been wound around the cylinder tube, when the pair of the clamping reinforced plates at both ends of the mounting band are tightened up to the first position by the clamping screw, the base ends of the clamping reinforced plates adjacent to the cylinder tube approach each other and clamp the mounting band, thereby temporarily fixing the cylinder tube. At this clamping position, the clamping reinforced plates abut against the holder but do not clamp it. Hence, even if the position detecting switch is mounted in the holder, the switch is not position-fixed.

Thereafter, when the clamping screw is tightened up to the second clamping position, the ends opposite to the above-described base ends of the clamping reinforced plates approach each other and the position detecting switch is fixed, as well as the clamping and fixing with respect to the cylinder tube is enhanced.

Thereby, the position detecting switch is fixed to the cylinder tube, and the clamping force of the switch can be adjusted by the clamping force of the clamping screw. In this case, as described above, the position detecting switch is arranged to be clamped by the clamping of the holder after the base ends of the clamping reinforced plates adjacent to the cylinder tube have approached each other. Therefore, it is possible to adjust the clamping force with respect to the position detecting switch substantially irrespective of the clamping force of the mounting band.

When, by loosing the clamping screw, the clamping screw is returned to the first clamping position from a clamping completion state where the clamping screw is at the second clamping position, the fixing of the position detecting switch is released in a state where the mounting band is fixed to the cylinder tube, so that the position can be easily finely adjusted.

Furthermore, when further clamping is performed from the second clamping position, at the third clamping position, the clamping restriction sections provided in the holder abut against each other, and thereby still further clamping by the screw is restricted. This inhibits excessive clamping of the position detecting switch 9, thereby preventing damage to the switch 9 due to the clamping action.

When using the above-described holder formed into a substantially U-shaped cross section, the first clamping position of the clamping screw becomes a position within the range where a slit exists between the pair of clamping sections in the holder; the second clamping position becomes a position where the pair of clamping sections in the holder make partial contact with each other and the slit remains in part; and the third clamping position becomes a position where the pair of clamping sections in the holder are subjected to overall pressure contact.

In this manner, according to the position detecting switch fixture of the present invention, a single clamping screw enables to fix the mounting band to the cylinder tube, as well as to fix the position detecting switch that has been subjected to a fine adjustment of position by the clamping screw. This significantly improves the work efficiency in mounting/demounting of the mounting band with respect to the cylinder tube, and the positioning and mounting of the position detecting switch.

In an embodiment according to the present invention, the above-described holder having a substantially U-shaped cross section is formed by integrally molding synthetic resin to form a pair of side surfaces including a holding section for the position detecting switch, clamping sections therefor extending from the holding section, and a connection section for connecting the side surface sections.

Also, this holder may be formed by molding synthetic resin to form the holder body having a pair of side surface sections including the holding section for the position detecting switch, and the clamping sections therefor extending from the holding section; forming by bending a metal plate a bracket having the connection section that connects and retains the side surface sections on the cylinder tube side and abutting walls against the outer surface sides of the side surface sections; and engaging a portion of the abutting walls of the bracket, fitted to the holder body, with a portion of the holder body. In this case, it is preferable that the holder body includes a groove formed in a portion facing the connection section of the bracket, and a projection provided to the connection section of the bracket for keeping the groove at a specified width.

Furthermore, in an embodiment according to the present invention, there are provided a locking member having fixing means for fixing thereto the held section by the holder of the position detecting switch, and locking sections for restricting of the moving range of the switch; and stopper sections for restricting the insertion limit and the withdrawal limit of the position detecting switch by the locking sections being locked to a portion of the holder or clamping screw.

More specifically, as for the fixing means, the locking member includes a projecting member fitted into a hole provided in the position detecting switch, for restricting the movement of the switch in the axial direction thereof, and a pair of embracing members for embracing the side surfaces of the position detecting switch and being mounted to the position detecting switch. On the other hand, as the locking sections, the locking member includes a locking projecting member for restricting the insertion limit of the position detecting switch, by using a portion of the clamping screw as the stopper section, to cause the locking projecting member to abut against the stopper section; and locking front sections at the tips of the embracing members, for restricting the withdrawal limit of the position detecting switch, by using an elastic protrusion elastically protruding from the holder toward the housing section of the position detecting switch, to cause the locking front sections to abut against the stopper section.

In the position detecting switch fixture according to the present invention, the holder is exchangeable so that when the position detecting switch with different configuration is to be mounted, the holder with the switch housing section adaptable to the switch can be mounted between the clamping reinforced plates of the mounting band. This allows a single mounting band to meet the holder with a plurality of shapes of position detecting switches by the exchange of holders.

As described above, according to the switch fixture of the present invention, a single clamping screw enables the mounting band for the position detecting switch to be fixed to the cylinder tube, as well as allows the position detecting switch that has been subjected to a fine adjustment of position by the clamping screw to be fixed. This improves the work efficiency in mounting/demounting of the mounting band with respect to the cylinder tube, and the positioning and mounting of the position detecting switch. Also, a single clamping screw enables to adjust the clamping force with respect to the position detecting switch substantially irrespective of the clamping force of the mounting band, as well as to inhibit the position detecting switch from being subjected to a force that is stronger than necessary.

DESCRIPTION OF THE PREFERRED EMBODIMENTS

Figure 1:
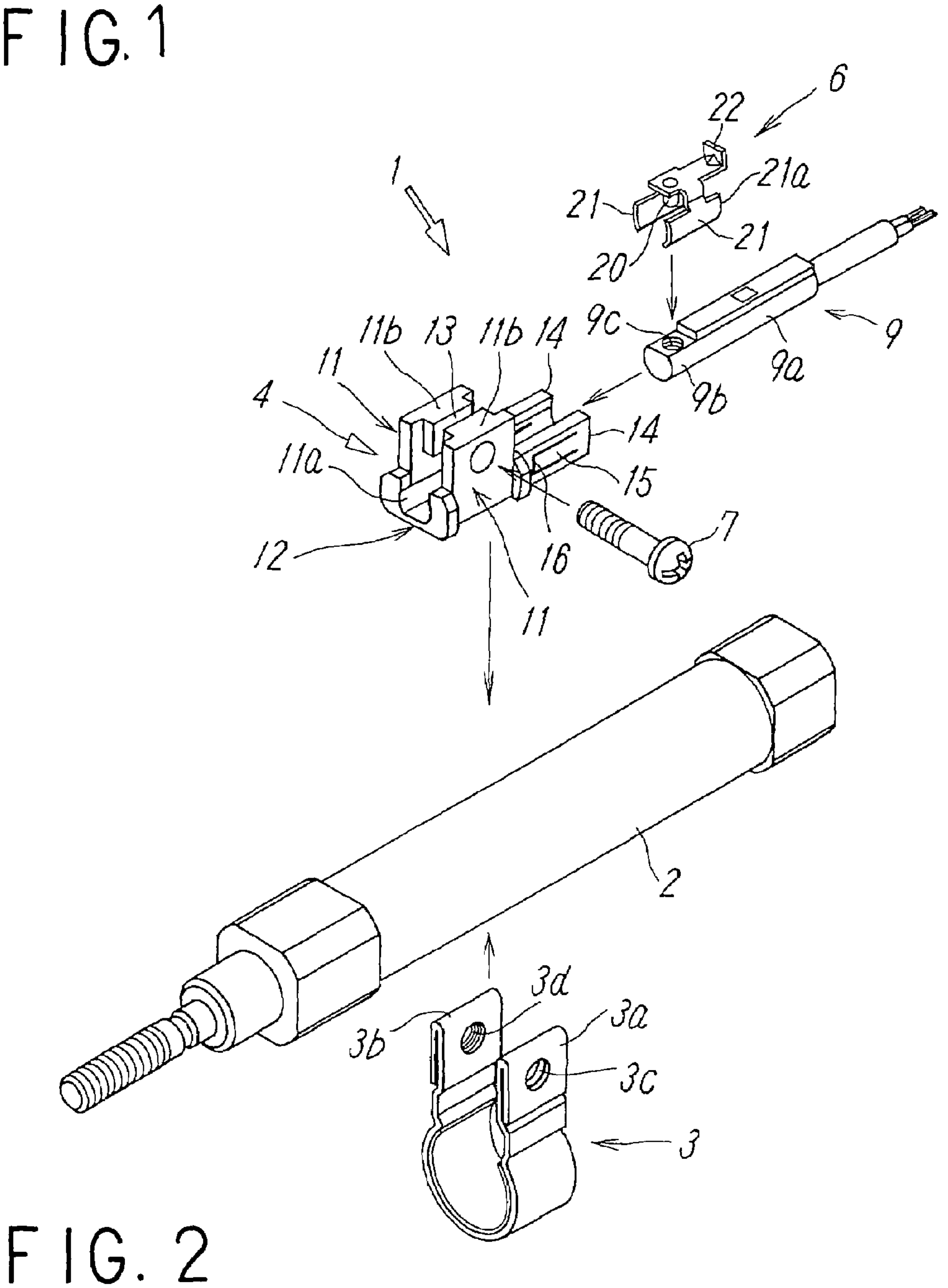
FIG. 1 is an exploded perspective view of a switch fixture according to a first embodiment of the present invention.
Figure 2:
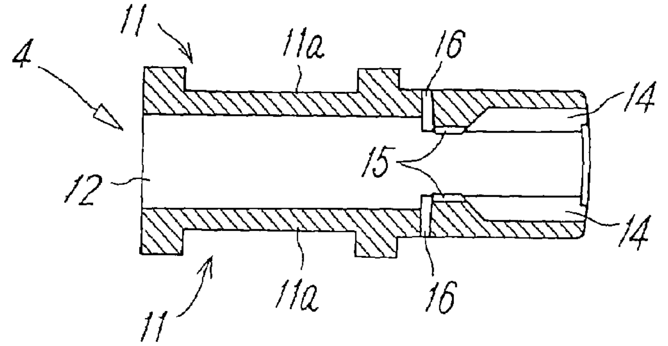
FIG. 2 is a horizontal sectional view of a holder according to the first embodiment.
Figure 3:
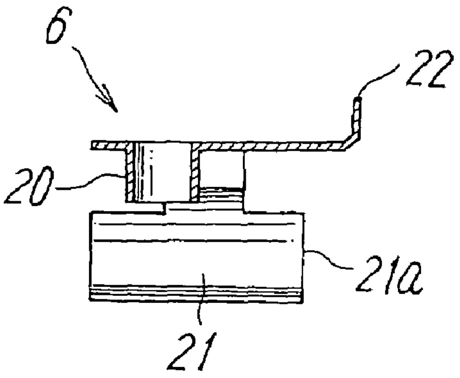
FIG. 3 is a side sectional view of a locking member to be mounted to a position detecting switch according to the first embodiment.

FIGS. 1 to 4 show a position detecting switch fixture according to a first embodiment of the present invention.

A switch fixture 1 according to the first embodiment includes a mounting band 3 wound around the outer peripheral surface of a cylinder tube 2 of a fluid pressure cylinder, a holder 4 mounted to the mounting band 3, for holding a position detecting switch 9, a locking member 6 fixed to the position detecting switch 9, for restricting the moving range of the switch, and a clamping screw 7 claiming the mounting band 3 to the outer peripheral surface of the cylinder tube 2, and also clamping the holder 4 to fix the position detecting switch 9.

As the position detecting switches 9, a conventional general-purpose product commonly used and sold, or one newly developed for this fixture can be used. As shown in FIG. 1, this position detecting switch typically has a bar-shaped section 9*a* having a specified cross section for allowing the mounting position in the axial direction of the switch to be adjusted. A portion of the bar-shaped section 9*a* has therein a switch section, and another portion thereof has a held section 9*b* provided with a strength enough to fix thereto the cylinder tube or the like. When required, a screw hole 9*c* for fixing the position detecting switch 9 to a switch mounting groove of the cylinder tube or the like is provided in the held section 9*b*. This type of position detecting switch is applicable to be mounted by this fixture.

The mounting band 3 to be wound around the cylinder tube 2 has a pair of clamping reinforced plates 3*a* and 3*b* mutually opposing at both ends thereof, and is arranged to retain the position detecting switch 9 together with the holder 4 between these claiming reinforced plates 3*a* and 3*b* by the clamping screw 7 passed therethrough (see FIGS. 5A to 5D). The aforementioned clamping screw 7 is arranged to be inserted through a hole 3*c* provided in one clamping reinforced plate 3*a*, and then screwed into a screw hole 3*d* provided in the other clamping reinforced plate 3*b*.

The holder 4 to be installed between the pair of clamping reinforced plates 3*a* and 3*b* is integrally molded of synthetic resin. As shown in FIGS. 1, 2, 4 and 5, a pair of side surface sections 11 covering both side surfaces of the held section 9*b* of the position detecting switch 9 are connected with each other at a connection section 12 provided on the side adjacent to the cylinder tube 2, thereby forming a substantially U-shaped cross section. Also, a housing section for the position detecting switch 9 is formed in a position on the side adjacent to the inner surface of the connection section 12 in the holder 4, namely, in a position as near as possible to the cylinder tube 2 for the purpose of enhancing detection sensitivity, whereby the switch 9 can be held by the pair of side surface sections 11 in a state of being position-adjustable in the axial direction thereof.

In addition, each of the side surface sections 11 of the holder 4 has a clamping section 11*b* further extending from a hold section 11*a* for the switch 9. In a state where the switch is not clamp-fixed, a slit 13 is adapted to be formed between the pair of the clamping sections 11*b*. The clamping screw 7 passes through the holder 4 at the clamping sections 11*b*. When the switch 9 is clamp-fixed, the slit 13 constitutes an interference margin.

As for the holder 4, the only essential necessities are that it can cover at least both side surfaces of the held sections 9*b* of the position detecting switch 9 along the surfaces, and that it can be clamped by the clamping screw 7. In the illustrated embodiment, as a stopper section against which a locking section (described later) of the locking member 6 fixed to the switch 9 is to abut, an elastic protrusion 15 that restricts the withdrawal limit of the position detecting switch 9 by causing the locking section to be locked to the elastic protrusion 15, is integrally provided. More specifically, as clearly shown in FIGS. 2 and 4, in the holder 4, extending sections 14 extending along the position detecting switch 9 from the hold section 11a for the position detecting switch 9 are integrally provided with the holder 4 in a continuous manner, and U-shaped slits 16 are formed in the extending sections 14, thereby forming an elastic protrusion 15 elastically protruding toward the housing section of the switch 9 on the holding section 11*a* side.

FIGS. 5A to 5D show usage modes of a switch fixture different in form of the mounting band 3 from that of the first embodiment but having substantially the same construction as that in the first embodiment. In this switch fixture 1, when the clamping reinforced plates 3*a* and 3*b* of the mounting band 3 are clamped by the clamping screw 7 from the state where the holder 4 and the switch 9 are entirely non-constrained as shown in FIG. 5A, firstly, as shown in FIG. 5B, the base ends of the clamping reinforced plates 3*a* and 3*b* adjacent to the cylinder tube 2 approach each other, thereby clamping the cylinder tube 2. Thereafter, the clamping reinforced plates 3*a* and 3*b* assume positions substantially parallel to each other, and at this point, the clamping reinforced plates 3*a* and 3*b* become abutted against substantially the entire outer surfaces of the holder 4. At this clamping position, the mounting band 3 is temporarily fixed to the cylinder tube 2, but the position detecting switch 9 held by the holder 4 is not position-fixed. Hereinafter, this clamping position is referred to as a "first clamping position".

At the above-described first clamping position of the clamping screw 7, the slit 13 exists between the pair of clamping sections 11*b* of the holder 4, and thereby the switch 9 is not clamped by the holder 4. Therefore, this is a clamping position within the range in which the switch is not position-fixed. In this state, the position of the switch 9 in the axial direction can be fine-adjusted.

A second clamping position (see FIG. 5C) where the switch 9 is fixed to the holder 4 by subsequent clamping by the clamping screw 7 is a position where the ends of the pair of clamping reinforced plates 3*a* and 3*b* on the tip side approach each other, and the pair of the clamping sections 11*b* in the holder 4 make partial contact with each other to thereby leaving the slit 13 in part. At this second clamping position, the degree of clamping of the switch 9 can be appropriately adjusted by the clamping screw 7. Concurrently with the fixing of the switch 9, the clamp-fixing of the cylinder tube 2 can be enhanced.

When the state is returned to that of FIG. 5B by loosing the clamping screw 7 from the above-described state, the position detecting switch 9 held in the holder 4 becomes position-adjustable although the mounting band 3 remains fixed to the cylinder tube 2.

The opposing surfaces of the pair of clamping sections 11*b* in the holder 4 constitute the clamping restriction section for restricting the clamping limit by the screw 7. As shown in FIG. 5D, the position where, from the second clamping position, the above-described clamping restriction section is subjected to an overall pressure contact by further clamping by the clamping screw 7, is a third clamping position. At this third clamping position, the pressure contact of the clamping regulation section restricts still further clamping by the screw 7, thereby preventing a damage of the position detecting switch 9 due to excessive clamping. However, for fixing the position detecting switch 9, it is not always necessary to perform clamping up to the third clamping position.

Here, at the stages of clamping by the clamping screw 7 in FIGS. 5A to 5D, the pair of clamping reinforced plates 3*a* and 3*b* at both ends of the mounting band 3 is to change their tilt angles. However, the hole 3*c* of the clamping reinforced plate 3*a* is arranged to have a tilt angle to an extent allowing a tilt of the clamping screw 7, and the hole 3*d* provided in the other clamping reinforced plate 3*b* also allows a tilt of the clamping screw 7 to some extent. Therefore, there is no hindrance in clamping the clamping reinforced plates 3*a* and 3*b*.

When attempting to clamp-fix the position detecting switch 9 by the holder 4, in order that the held section 9*b*, which is provided with a strength enough to fix the switch 9, is always clamped and held, a locking member 6 that limits the moving range of the position detecting switch 9 in the axial direction thereof in the holder 4, is provided in the switch 9. The construction and operations of this locking member 6 will now be described with reference to FIGS. 1, 3, and 4.

The locking member 6 is mounted to the held section 9*b* by the holder 4 for the position detecting switch 9, and used for restricting the insertion and withdrawal limits of the position detecting switch 9, by using a portion of the holder 4 or clasping screw 7 as a stopper section, to cause the locking section to be locked to the stopper. The locking member 6 includes fixing means for fixing thereto the held section 9*b* for the position detecting switch 9, and the locking section to be locked to the stopper section.

The above-described fixing means for fixing the locking member 6 to the position detecting switch 9 includes a projecting member 20 that is inserted through the screw hole 9*c* provided in the held section 9*b* of the switch 9, or alternatively through an appropriate hole provided in the switch 9 for the fixing of this locking member 6, and that inhibits the movement of the switch 9 in the axial direction thereof; and a pair of embracing members 21 for embracing the side surfaces of the position detecting switch 9 and being mounted to the switch 9.

The locking section in the locking member 6 comprises a locking projecting member 22 that restricts the insertion limit of the position detecting switch 9 with respect to the housing section in the holder 4, by using a portion of the clamping screw 7 as a stopper section, to cause the locking projecting member 22 to abut against this stopper; and locking front sections 21*a* at the tips of the embracing members, the locking front sections 21*a* restricting the withdrawal limit of the position detecting switch 9, by using an elastic protrusion 15 elastically protruding from the extending section 14 of the holder 4 toward the housing section of the position detecting switch 9 as the stopper section, to cause the locking front sections 21*a* to abut against the stopper section.

The locking member 6 can be mounted to the position detecting switch 9 by inserting the projecting member 20, serving as fixing means with respect to the position detecting switch 9, into the screw hole 9*c* provided on the switch 9 to inhibit the movement of the switch 9 in the axial direction thereof, and by causing the pair of embracing members 21 to embrace the side surfaces of the position detecting switch 9. In this situation, when the held section 9*b* of the position detecting switch 9 is to be housed in the housing section in the holder 4, the moving range of the position detecting switch 9 is restricted to the area between the position where the locking section comprising the locking projecting member 22 locks the clamping screw 7 used as the stopper section, and the position where the locking section comprising the locking front sections 21*a* at the tips of the embracing members 21 lock the elastic protrusion 15 elastically protruding from the extending section 14 of the holder 4 toward the housing section of the position detecting switch 9 used as the stopper section. Hence, the position detecting switch 9 can be moved only within the above-described moving range. This allows the held section 9*b* provided with a strength enough for the fixing of the position detecting switch 9 by the holder 4 to be reliably fixed at all times.

In general, when a portion of the clamping screw 7 is used as the stopper section, the insertion limit of the position detecting switch 9, at which the locking projecting member 22 abuts against the portion of the clamping screw 7, is a position where the tip of the switch 9 substantially conforms to the front surface of the holder 4. On the other hand, the withdrawal limit of the position detecting switch 9, at which the locking front sections 21*a* at the tips of the embracing members 21 abut against the elastic protrusion 15, is a limit position where the held section 9*b* of the position detecting switch 9 can be stably grasped.

Figure 4:
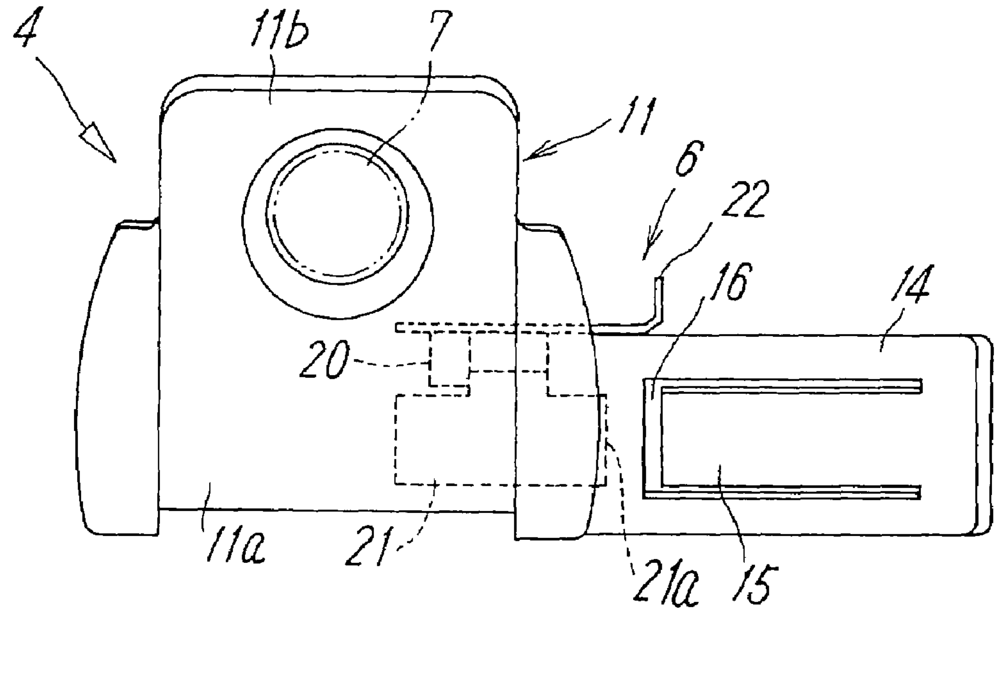
FIG. 4 is a diagram showing a positional relation between the locking member and the holder etc. in a state where the position detecting switch has been mounted.
Figure 5:
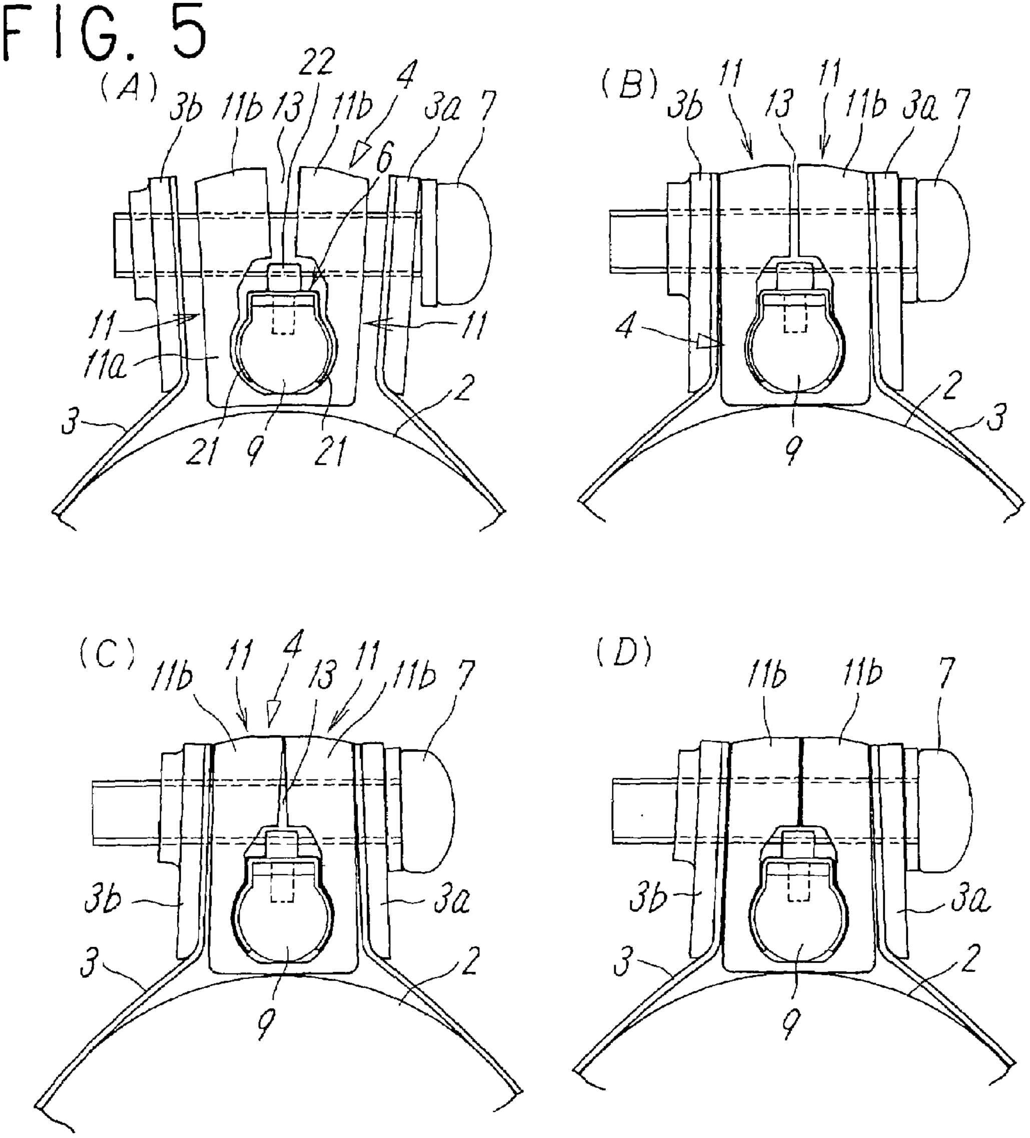
FIGS. 5A to 5D are longitudinal sectional views of main sections for illustrating usage modes thereof in the first embodiment, wherein the usage modes are different only in aspects of the mounting band.

In FIG. 4, in order to facilitate the understanding of the range in which the locking member 6 can move within the holder 4, positional relationships concerning the range is illustrated.

Meanwhile, when the switch 9 is inserted from the side of the extending section 14 of the holder 4, there is no possibility that the elastic protrusion 15 may retreat from the housing section of the switch 9 to thereby interfere with the insertion of the switch. However, once the switch has been inserted, the switch 9 cannot be removed unless the locking front sections 21*a* at the tips of the embracing members 21 locked to the stopper constituted of the elastic protrusion 15 is removed, because of the above-described limitation of the movement of the switch 9.

When the position detecting switch 9 needs to be moved out of its moving range that is restricted, it suffices only to change the position of the mounting band 7 itself.

Figure 6:
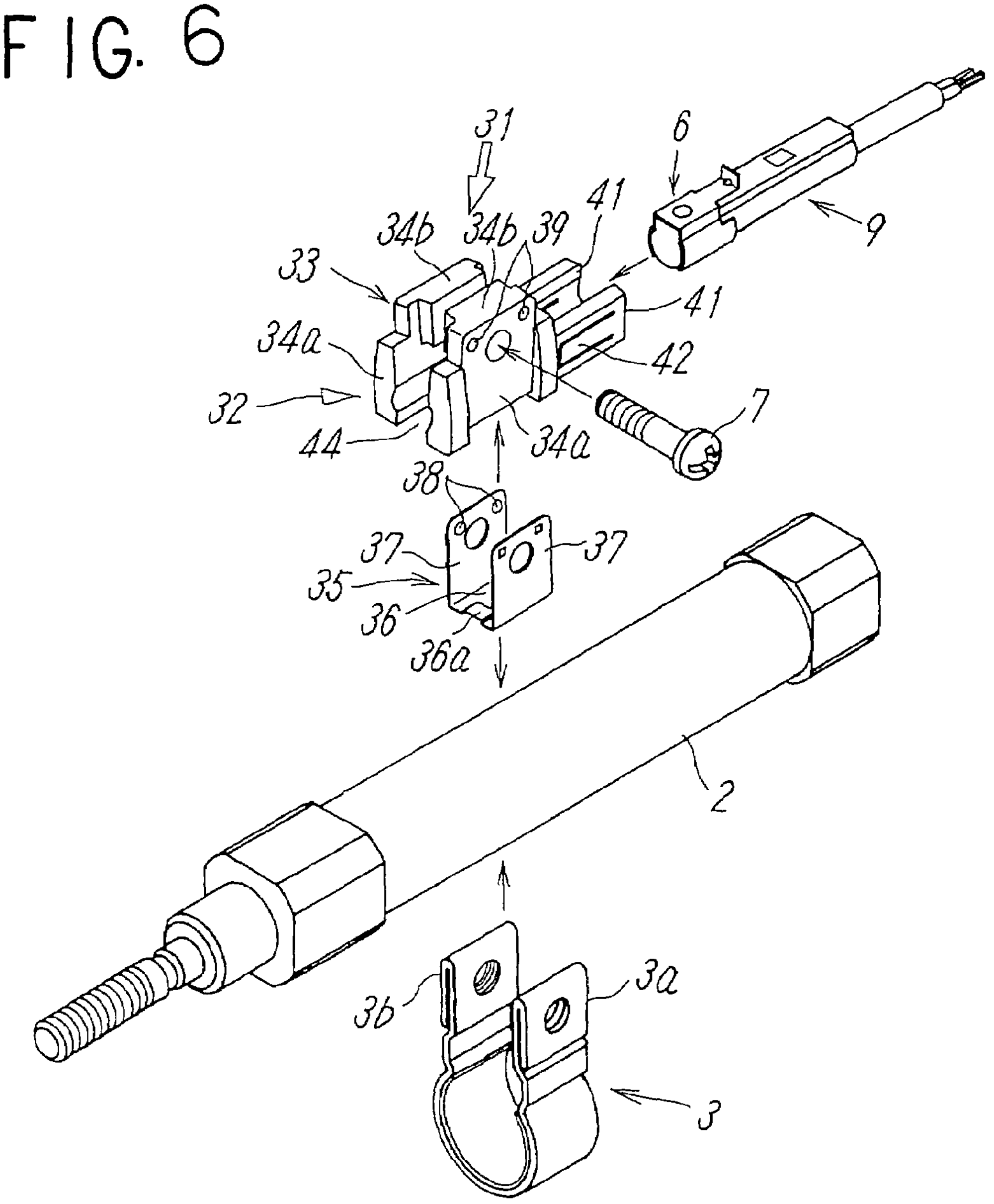
FIG. 6 is an exploded perspective view of a switch fixture according to a second embodiment of the present invention.
Figure 7:
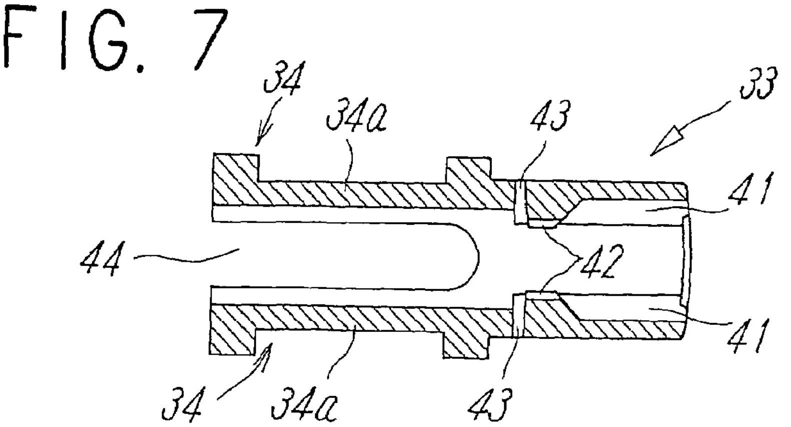
FIG. 7 is a horizontal sectional view of a holder body according to the second embodiment.

FIGS. 6 and 7 show a position detecting switch fixture according to a second embodiment of the present invention.

A holder 31 according to the second embodiment differs from that in the first embodiment in the specific structure of a holder 32 for holding the position detecting switch 9. However, the other parts including the mounting band 3, the locking member 6 to be mounted to the position detecting switch 9, and the clamping screw 7 for clamping the mounting band 3 are substantially the same as those in the first embodiment although they are different in shape in a part between the first and second embodiments. Therefore, the descriptions hereinafter will be made only for the differences from the first embodiment. Substantially the same parts in main sections of the figures are identified by the same reference numerals as those in the first embodiment, and detailed descriptions are omitted.

The holder 32 in the second embodiment comprises a holder body 33 having a pair of side surface sections 34 including a holding section 34*a* for the position detecting switch 9 and clamping sections 34*b* therefor upward extending from the holding section 34*a*; a connection section 36 connecting and retaining the pair of side surface sections 34 on the side adjacent to the cylinder tube 2; and a bracket 35 having abutting walls 37 abutting against the outer surfaces of the side surface sections 34. In the bracket 35, which is fitted to the outside of side surface sections 34 of the holder body 33, a plurality of projecting members 38 provided on the inner side surfaces of the abutting walls 37 are engaged with recesses 39 provided in portions of the holder body 33, and thereby positioning for securing the conformity between the bracket 35 and the holder 32 is performed (see FIG. 10).

As in the case of the first embodiment, extending sections 41 extending along the position detecting switch 9 from the hold section 34*a* for the position detecting switch 9 of the holder body 33 are integrally provided in a continuous manner, and U-shaped slits 43 are formed in the extending sections 41, thereby forming an elastic protrusion 42 elastically protruding toward the housing section of the switch 9 on the holding section 34*a* side. These are integrally formed of synthetic resin.

Also, the above-described bracket 35 having the connection section 36 and the abutting walls 37 is formed by bending a nonmagnetic metal plate.

The holder body 33 is configured so that a groove 44 is provided in a portion facing the connection section 36 of the bracket 35, and that the switch 9 is brought close to the cylinder tube 2 to the extent possible. The connection section 36 of the bracket 35 has a projection 36*a*, formed by cutting and raising a portion of the connection section 36, fitted into the groove 44 so that the groove can be kept at a specified width even when the holder 32 is clamped by the clamping screw 7. This prevents the holder body 33 having the groove 44 therein from becoming deformed.

In the holder body 33, of which the pair of side surface sections 34 are separated by providing the groove therebetween, the pair of the side surface sections 34 are connected with each other at a lower position of the extending section 41, as can be seen from FIG. 7.

Other constructions, operations, and usage methods in this second embodiment are substantially the same as those in the first embodiment except in that the holder 32 is reinforced by the bracket 35.

Figure 8:
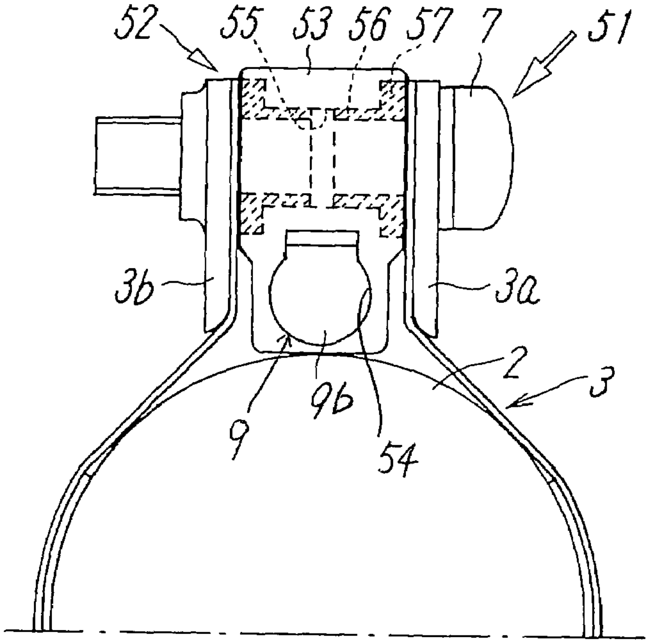
FIG. 8 is a longitudinal sectional view of a switch fixture according to a third embodiment of the present invention.
Figure 9:
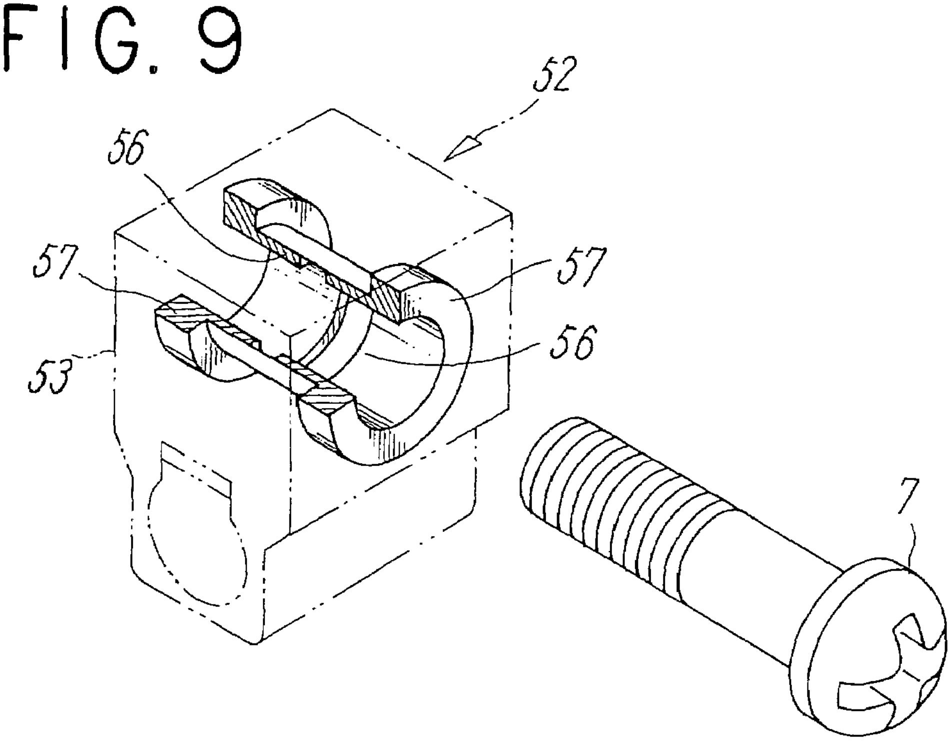
FIG. 9 is a perspective view of a holder according to the third embodiment.

FIGS. 8 and 9 show a third embodiment according to the present invention. In the switch fixture 51 according to the third embodiment, the holder 52 is formed of a material having rubber elasticity, such as a synthetic rubber, a soft synthetic resin, or the like.

As compared with the first embodiment, the switch fixture 51 of the third embodiment is different from in the specific structure of the holder 52 for holding the position detecting switch, as well as the above-described locking member 6 is configured not to be mounted to the position detecting switch to be used. When the moving range of the position detecting switch 9 is to be restricted, the construction thereof must be considered separately.

However, the other parts including a mounting band 3, and a clamping screw 7 for clamping the mounting band 3 are substantially the same as those in the first embodiment. Therefore, descriptions hereinafter will be made of only differences from the first embodiment. Substantially the same parts in main sections of the figures are identified by the same reference numerals as those in the first embodiment, and detailed descriptions are omitted.

In a holder block 53 comprising a material having rubber elasticity, the holder 52 in the third embodiment includes a switch insertion hole 54 for covering at least the side surfaces of the held sections 9*b* of the position detecting switch 9, and an insertion hole 55 for the clamping screw 7 orthogonally intersecting the aforementioned switch insertion hole 54 in a plan view. The switch insertion hole 54 is disposed at a position adjacent to the cylinder tube 2 in the holder block 53. On the other hand, the insertion hole 55 for the clamping screw 7 is provided so as to pass through the holder block 53 at the same position as in the first and second embodiments, that is, the position corresponding to the pair of the clamping reinforced plates 3*a* and 3*b* in the mounting band.

Also, a clamping restriction member for restricting excessive clamping at the third clamping position by the clamping screw 7 is attached to the insertion hole 55 for the clamping screw 7 in the holder block 53. The clamping restriction member is inserted through the insertion hole 55 in the holder block 53, and comprises a pair of sleeves 56 constituted of a rigid material and through which the clamping screw 7 is inserted. A flange 57 provided on each of the ends of the sleeves 56 is disposed at the position facing a respective one of the clamping reinforced plates 3*a* and 3*b* of the mounting band 3 in the insertion hole 55. Between the two sleeves 56, a compression margin with respect to pressure contact is allowed for, at the third clamping position. This compression margin corresponds to the slit 13 in the first and second embodiments.

When using the holder 52 with the foregoing constructions, upon clamping the clamping screw 7, the holder block 53 is compressed via the clamping reinforced plates 3*a* and 3*b*, and is elastically deformed, so that the position detecting switch 9 inserted through the switch insertion hole 54 is clamp-fixed. This corresponds to the second clamping position. When the clamping of the holder block 53 by the clamping screw 7 further progresses, the facing ends of the opposing pair of sleeves 56 mutually approach and finally make pressure contact with each other. In this situation, it is impossible to clamp the opposing clamping reinforced plates 3*a* and 3*b*, thereby preventing a damage of the position detecting switch 9 due to excessive clamping. This clamping position corresponds to the third clamping position.

Figure 10:
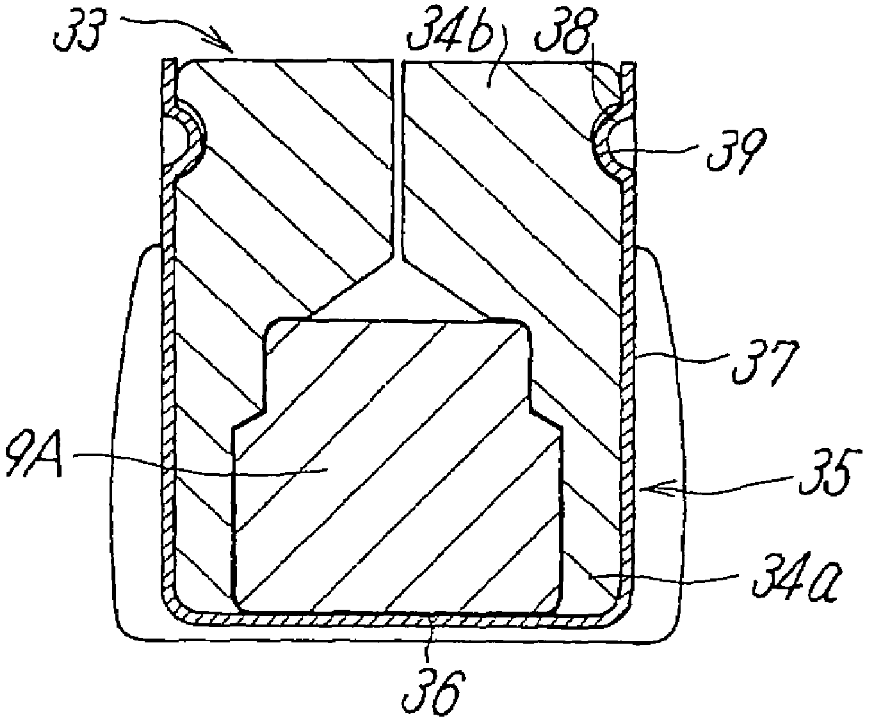
FIG. 10 is a sectional view showing the case where a switch fixture having substantially the same construction as that in the second embodiment is applied to the mounting of a position detecting switch of a type different from those in the other embodiments.

FIG. 10 shows another position detecting switch 9A being different in outer shape from the above-described position detecting switch 9, but having substantially the same structure as that in the second embodiment. In FIG. 10, an aspect is illustrated in which the shape of the housing section for the switch on the inner side of the holder body 33 is conformed to the switch 9A, and in which the switch 9A is fixed using the holder body 33.

More specifically, the above-described switch fixture can selectively mount the holder between the clamping reinforced plates 3*a* band 3*b* at both ends of the mounting band having a shape in conformance with a shape of the position detecting switch. In main sections in FIG. 10, the same reference numerals as those in the second embodiment are used to designate the same parts.

In this manner, the above-described switch fixture can accommodate a plurality of position detecting switches having outer shapes different from one another, only by conforming the shape of the holder or the holder body to that of the switch.

The invention claimed is:

1. A position detecting switch fixture for a cylinder, the fixture comprising:

a mounting band to be wound around a cylinder tube;

a pair of clamping reinforced plates opposed at both ends of the mounting band;

a position detecting switch;

a holder mounted to the mounting band, for holding the position detecting switch; and a clamping screw passed through the pair of clamping reinforced plates and retaining the position detecting switch together with the holder, between the clamping reinforced plates, wherein:

the holder covering at least both side surfaces of a held section of the position detecting switch along the side surfaces, is installed between the pair of clamping reinforced plates to position-adjustably clamp the position detecting switch, and the clamping screw is also passed through the holder; and wherein:

the clamping screw is provided with the following clamping positions:

a first clamping position where, due to the clamping of the pair of clamping reinforced plates by the clamping screw, the base ends of the clamping reinforced plates adjacent to the cylinder tube approach each other and thereby the mounting band is temporarily fixed with respect to the cylinder tube, but the position detecting switch is not position-fixed;

a second clamping position where, due to subsequent clamping of the pair of clamping reinforced plates by the screw, the ends of the pair of clamping reinforced plates opposite to said base ends approach each other and thereby the switch is fixed to the holder, as well as the clamping and fixing of the cylinder tube is enhanced; and a third clamping position where, due to further clamping of the pair of clamping reinforced plates by the screw, clamping regulation sections provided in the holder abut against each other to restrict still further clamping of the pair of clamping reinforced plates by the screw.

2. The fixture according to claim 1, wherein the holder is configured so that:

by mutually connecting side surface sections covering both side surfaces of the held section of the position detecting switch at a connection section provided on the side adjacent to the cylinder tube, the cross section of the holder is formed into a substantially U-shape, and a housing section of the position detecting switch is formed in a position on the side adjacent to the inner surface of the connection section; and each of the side surface sections has a clamping section further extending from the holding section for the position detecting switch, a slit is formed between the pair of clamping sections, and the clamping screw is also passed through the clamping sections of the holder.

3. The fixture according to claim 2, wherein the holder is formed by integrally molding synthetic resin to form a pair of side surface sections including a holding section for the position detecting switch, clamping sections therefor extending from the holding section, and a connection section for connecting the side surface sections.

4. The fixture according to claim 2, wherein the holder is constructed by:

forming by molding synthetic resin the holder having a pair of side surface sections including the holding section for the position detecting switch and the clamping sections therefor extending from the holding section;

forming by the bending of a metal plate a bracket including a connection section that connects and retains the side surface sections on the cylinder tube side, and abutting walls abutting against the outer surface sides of the side surface sections; and engaging a portion of the abutting walls of the bracket, fitted to the holder body, with a portion of the holder body.

5. The fixture according to claim 4, wherein the holder body comprises:

a groove formed in the portion facing the connection section of the bracket; and a projection provided to the connection section of the bracket for keeping the groove to a specified width.

6. The fixture according to claim 2, wherein:

the first clamping position of the clamping screw is a position within the range where a slit exists between the pair of clamping sections in the holder;

the second clamping position is a position where the pair of clamping sections in the holder make partial contact with each other, and the slit remains in part; and the third clamping position is a position where the pair of clamping sections in the holder are subjected to overall pressure contact.

7. The fixture according to claim 2, further comprising:

a locking member including fixing means for fixing thereto the held section by the holder of the position detecting switch, and locking sections for restricting the moving range of the switch; and stopper sections for restricting the insertion limit and the withdrawal limit of the position detecting switch by the locking sections being locked to a portion of the holder or the clamping screw.

8. The fixture according to claim 7, wherein:

as the fixing means, the locking member comprises:

a projecting member fitted into a hole provided in the position detecting switch, for inhibiting the movement of the switch in the axial direction thereof; and a pair of embracing members embracing the side surfaces of the position detecting switch and being mounted to the switch; and as the locking sections, the locking member comprises:

a locking projecting member that restricts the insertion limit of the position detecting switch, by using a portion of the clamping screw as the stopper section, to cause the locking projecting member to abut against the stopper section; and locking front sections at the tips of the embracing members, the locking front sections restricting the withdrawal limit of the position detecting switch, by using an elastic protrusion elastically protruding from the holder toward the housing section of the position detecting switch, as the stopper section, to cause the locking front sections to abut against the stopper section.

9. The fixture according to claim 1, wherein:

the holder is configured to have a switch through hole covering at least the surroundings of the held section of the position detecting switch, and a clamping screw hole to be passed through by the clamping screw, the switch through hole and the clamping screw hole being provided in a holder block constituted of a material having rubber elasticity;

the switch through hole is disposed in a position in the holder, near to the cylinder tube; and clamping restriction members for restricting excessive clamping at the third clamping position by the clamping screw, are attached to the holder.

10. The fixture according to claim 1, wherein the holder is exchangeable so that when the position detecting switch with different configuration is to be mounted, the holder with the switch housing section adaptable to the switch can be mounted between the clamping reinforced plates of the mounting band.

* * * * *